(12) United States Patent
Li et al.

(10) Patent No.: US 10,269,907 B2
(45) Date of Patent: Apr. 23, 2019

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Chung-Ting Li, Hsinchu (TW); Chih-Hao Chang, Hsinchu (TW); Sheng-Yu Chang, Hsinchu (TW); Jen-Hsiang Lu, Hsinchu (TW); Jyun-Yang Shen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/918,394

(22) Filed: Mar. 12, 2018

(65) Prior Publication Data

US 2018/0204922 A1    Jul. 19, 2018

Related U.S. Application Data

(62) Division of application No. 15/098,060, filed on Apr. 13, 2016, now Pat. No. 9,947,756.

(Continued)

(51) Int. Cl.
*H01L 21/8238* (2006.01)
*H01L 21/84* (2006.01)
(Continued)

(52) U.S. Cl.
CPC .......... *H01L 29/41791* (2013.01); *H01L 21/823821* (2013.01); *H01L 21/845* (2013.01);
(Continued)

(58) Field of Classification Search
None
See application file for complete search history.

(56) References Cited

U.S. PATENT DOCUMENTS 7,667,271 B2    2/2010 Yu et al.
7,910,453 B2    3/2011 Xu et al.
(Continued)

OTHER PUBLICATIONS

Office Action Taiwanese Patent Application No. 10620361730 dated Apr. 6, 2017.

(Continued)

*Primary Examiner* — Telly D Green
(74) *Attorney, Agent, or Firm* — McDermott Will & Emery LLP

(57) ABSTRACT

In a method of manufacturing a semiconductor device, a first fin structure for an n-channel fin field effect transistor (FinFET) is formed over a substrate. An isolation insulating layer is formed over the substrate such that an upper portion of the first fin structure protrudes from the isolation insulating layer. A gate structure is formed over a part of the upper portion of the first fin structure. A first source/drain (S/D) epitaxial layer is formed over the first fin structure not covered by the gate structure. A cap epitaxial layer is formed over the first S/D epitaxial layer. The first S/D epitaxial layer includes SiP, and the cap epitaxial layer includes SiC with a carbon concentration is in a range from 0.5 atomic % to 5 atomic %.

20 Claims, 11 Drawing Sheets

Related U.S. Application Data

(60) Provisional application No. 62/296,935, filed on Feb. 18, 2016.

(51) Int. Cl.
*H01L 27/11* (2006.01)
*H01L 29/06* (2006.01)
*H01L 29/66* (2006.01)
*H01L 29/78* (2006.01)
*H01L 29/417* (2006.01)

(52) U.S. Cl.
CPC ...... *H01L 27/1104* (2013.01); *H01L 29/0649* (2013.01); *H01L 29/66795* (2013.01); *H01L 29/785* (2013.01); *H01L 29/7848* (2013.01)

(56) References Cited

U.S. PATENT DOCUMENTS

| | | |
|---|---|---|
| 8,377,779 B1 | 2/2013 | Wang |
| 8,399,931 B2 | 3/2013 | Liaw et al. |
| 8,487,378 B2 | 7/2013 | Goto et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,729,634 B2 | 5/2014 | Shen et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,826,213 B1 | 9/2014 | Ho et al. |
| 8,860,148 B2 | 10/2014 | Hu et al. |
| 8,887,106 B2 | 11/2014 | Ho et al. |
| 9,105,490 B2 | 8/2015 | Wang et al. |
| 9,337,057 B2 | 5/2016 | Park et al. |
| 9,449,975 B1 | 9/2016 | Ching et al. |
| 9,564,369 B1 | 2/2017 | Kim et al. |
| 9,947,756 B2 * | 4/2018 | Li ................. H01L 29/0649 |
| 2013/0056827 A1 | 3/2013 | Tsai et al. |
| 2014/0001574 A1 | 1/2014 | Chen et al. |
| 2014/0110755 A1 | 4/2014 | Colinge |
| 2014/0151812 A1 | 6/2014 | Liaw |
| 2014/0264348 A1 | 9/2014 | Tsai et al. |
| 2014/0282326 A1 | 9/2014 | Chen et al. |
| 2016/0020118 A1 | 1/2016 | Park et al. |
| 2016/0043170 A1 | 2/2016 | Park et al. |
| 2017/0076973 A1 | 3/2017 | Lee et al. |
| 2017/0092728 A1 | 3/2017 | Kim et al. |

OTHER PUBLICATIONS

Office Action issued in U.S. Appl. No. 15/098,060, dated Jul. 3, 2017.

Notice of Allowance issued in U.S. Appl. No. 15/098,060, dated Dec. 6, 2017.

* cited by examiner

SEMICONDUCTOR DEVICE AND MANUFACTURING METHOD THEREOF

This is application is a division of U.S. patent application Ser. No. 15/098,060, filed Apr. 13, 2016, now U.S. Pat. No. 9,947,756, which claims a priority of U.S. Provisional Application No. 62/296,935 filed Feb. 18, 2016, the entire contents of each of which are incorporated herein by reference.

TECHNICAL FIELD

The disclosure relates to a semiconductor integrated circuit, and more particularly to a source and drain epitaxial structure of a fin field effect transistor and its manufacturing process.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET) and the use of a metal gate structure with a high-k (dielectric constant) material. The metal gate structure is often manufactured by using gate replacement technologies, and sources and drains are formed by using an epitaxial growth method. Further, a source/drain (S/D) contact (a bar contact) is formed on the sources and drains.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the present subject matter. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanied drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed.

Figure 1A:
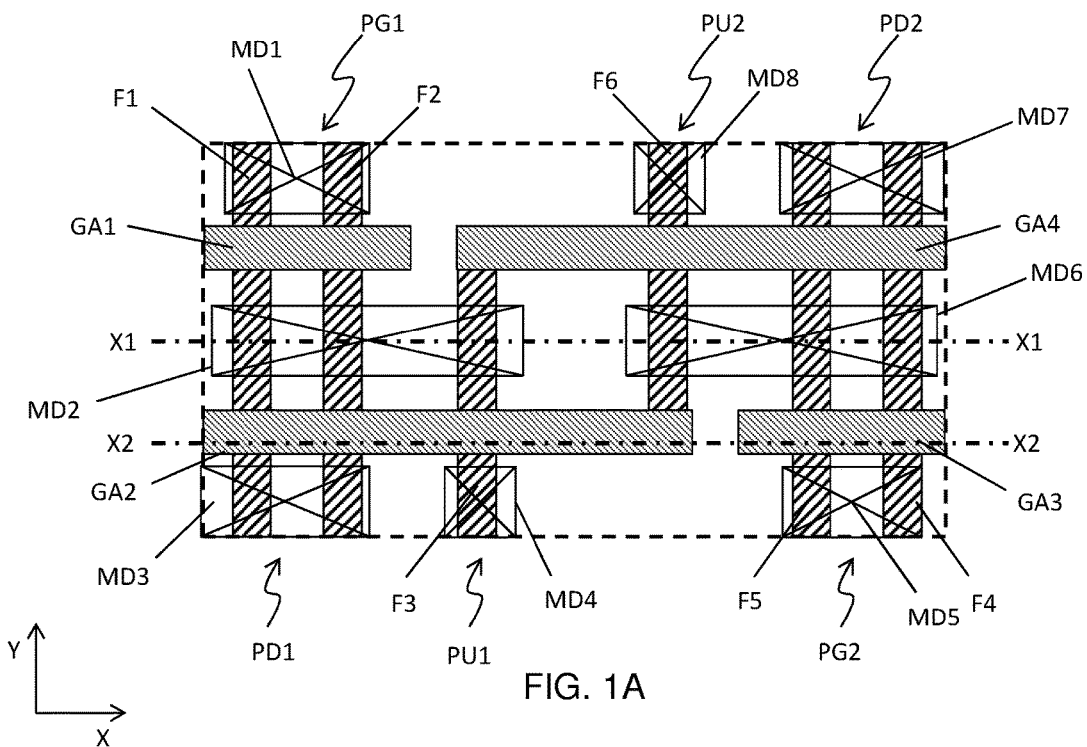
FIGS. 1A and 1B show exemplary layout structures of an SRAM cell according to one embodiment of the present disclosure.
Figure 1B:
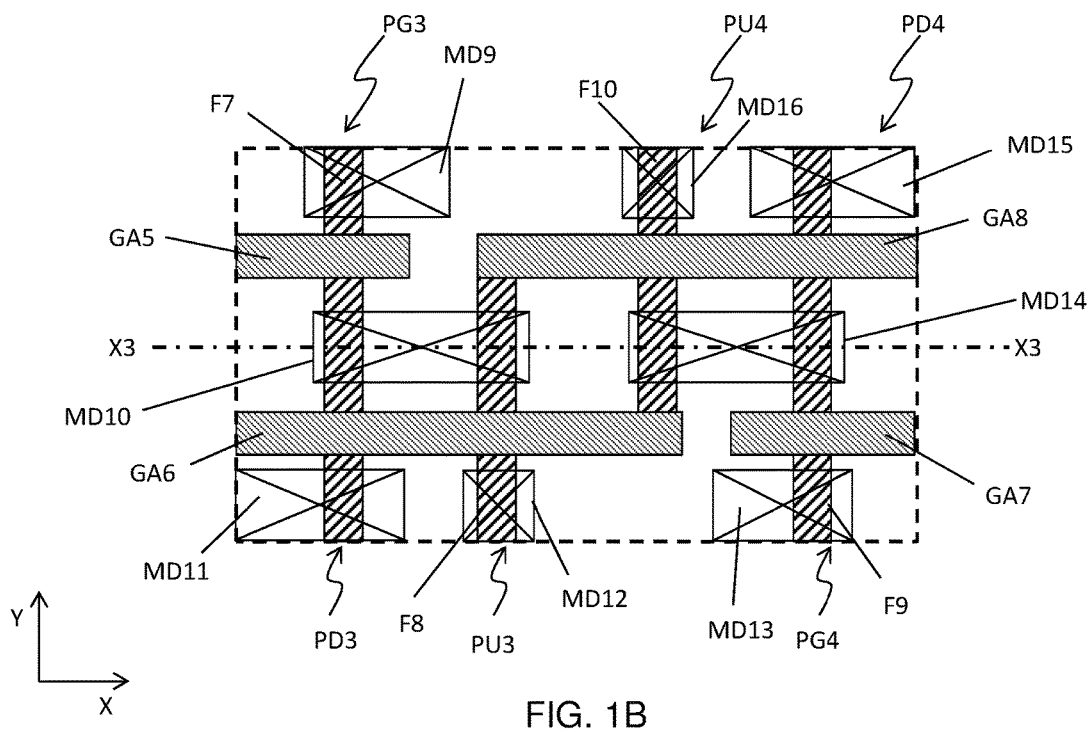
Figure 2:
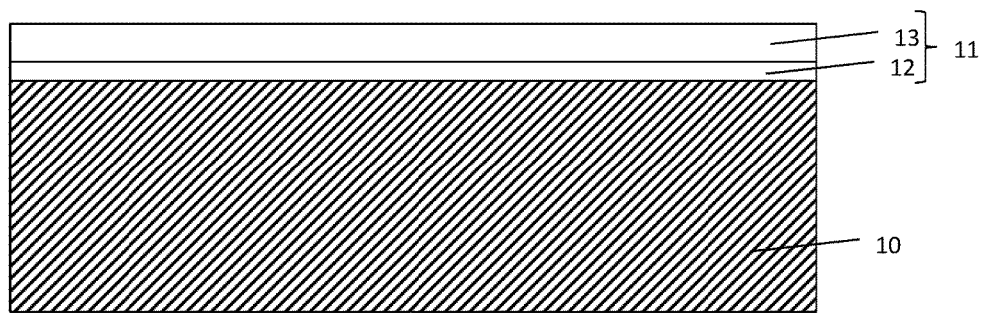
FIGS. 2-15 show exemplary cross sectional views of various stages of manufacturing operations of a first SRAM cell including FinFETs according to one embodiment of the present disclosure.

FIGS. 1A and 1B show exemplary layout structures of an SRAM cell according to one embodiment of the present disclosure.

FIG. 1A is an exemplary layout structure of a first SRAM cell including six fin structures. FIG. 1A shows one SRAM cell. A plurality of first SRAM cells may form an SRAM array in which the plurality of first SRAM cells are arranged in a matrix along a row direction and a column direction.

The first SRAM cell includes two cross-coupled inverters having a data storage node and a complementary data storage node. The output of the first inverter is coupled to the input of the second inverter, and the output of the second inverter is coupled to the input of the first inverter. The SRAM cell further includes a first pass-gate FinFET PG1 coupled to the output of the first inverter and the input of the second inverter and a second pass-gate FinFET PG2 coupled to the output of the second inverter and the input of the first inverter.

The first inverter includes a first first-conductivity-type (a first pull-up) FinFET PU1 and a first second-conductivity-type (a first pull-down) FinFET PD1. The second inverter includes a second first-conductivity-type (a second pull-up) FinFET PU2 and a second second-conductivity-type (a second pull-down) FinFET PD2. The first pass-gate device PG1 and the second pass-gate device PG2 are second-conductivity type devices. In this embodiment, the first conductivity type is a P-type and the second conductivity type is an N-type. Of course, it is possible in another embodiment that the first conductivity type is an N-type and the second conductivity type is a P-type, and in such a case the remaining elements in the SRAM are appropriately modified according to the common knowledge in the art.

The first pass-gate FinFET PG1 is constituted by a first fin structure F1, a second fin structure F2 and a first gate structure GA1 as shown in FIG. 1A. The portions of the first and second fin structures F1, F2 not covered by the first gate structure GA1 function as a source and a drain of the FinFET PG1. It is noted that in this disclosure, a source and a drain are interchangeably used and the term "a source/drain" or "an S/D" means one of a source and a drain.

The first pull-down FinFET PD1 is constituted by the first fin structure F1, the second fin structure F2 and a second gate structure GA2. The portions of the first and second fin structures F1, F2 not covered by the first gate structure GA2 function as a source and a drain of the FinFET PD1.

The first pull-up FinFET PU1 is constituted by a third fin structure F3 and the second gate structure GA2. The portions of the third fin structure F3 not covered by the second gate structure GA2 function as a source and a drain of the FinFET PU1.

The second pass-gate FinFET PG2 is constituted by a fourth fin structure F4, a fifth fin structure F5 and a third gate structure GA3. The portions of the fourth and fifth fin structures F4, F5 not covered by the third gate structure GA3 function as a source and a drain of the FinFET PG2.

The second pull-down FinFET PD2 and is constituted by the fourth fin structure F4, the fifth fin structure F5 and a fourth gate structure GA4. The portions of the fourth and fifth fin structures F4, F5 not covered by the fourth gate structure GA4 function as a source and a drain of the FinFET PD2.

The second pull-up FinFET PU2 is constituted by a sixth fin structure F6 and the fourth gate structure GA4. The portions of the sixth fin structure F6 not covered by the fourth gate structure GA4 function as a source and a drain of the FinFET PU2.

Still referring to FIG. 1A, the drains of the FinFETs PG1, PD1 and PU1 are electrically connected by a second bar contact MD2, which functions as the data storage node, and the drains of the FinFETs PG2, PD2 and PU2 are electrically connected by a sixth bar contact MD6, which functions as the complementary data storage node. The second bar contact MD2 is formed over the common drain regions of the first and second fin structures F1, F2 of the FinFETs PG1 and PD1 and the drain region of the third fin structure F3 of the FinFET PU1. The sixth bar contact MD6 is formed over the common drain regions of the fourth and fifth fin structures F4, F5 of the FinFETs PG2 and PD2 and the drain region of the sixth fin structure F6 of the FinFET PU2.

A first bar contact MD1 is formed over the source regions of the first and second fin structures F1, F2 of the FinFET PG1, a third bar contact MD3 is formed over the source regions of the first and second fin structures F1, F2 of the FinFET PD1, and a fourth bar contact MD4 is formed over the source region of the third fin structure F3 of the FinFET PU1. A fifth bar contact MD5 is formed over the source regions of the fourth and fifth fin structures F4, F5 of the FinFET PG2, a seventh bar contact MD7 is formed over the source regions of the fourth and fifth fin structures F4, F5 of the FinFET PD2, and an eighth bar contact MD8 is formed over the source region of the sixth fin structure F6 of the FinFET PU2.

The gate structures include a gate dielectric layer and a gate electrode. The source and drain regions of the fin structures include an epitaxial layer formed over the fin structure.

The gate electrodes of the first and second pass-gate FinFETs PG1, PG2 are coupled to a first word line, the first bar contact MD1 is coupled to a first bit line and the fifth bar contact MD5 is coupled to a first complementary bit line. The third bar contact MD3 and the seventh bar contact MD7 are coupled to a first potential, and the fourth bar contact MD4 and the eighth bar contact MD8 are coupled to a second potential different from the first potential. In one embodiment, the first potential is Vss, and the second potential is Vdd. When the first conductivity type is an N-type and the second conductivity type is a P-type, the first predetermined potential is Vdd and the second predetermined potential is Vss.

The fin structures extend in the Y direction and are arranged in parallel with each other in the X direction, and the gate structures extend in the X direction.

FIG. 1B is an exemplary layout structure of a second SRAM cell including four fin structures. FIG. 1B shows one SRAM cell. A plurality of second SRAM cells may form an SRAM array in which the plurality of second SRAM cells are arranged in a matrix along a row direction and a column direction. The second SRAM cell is formed in the same semiconductor device (chip) as the first SRAM cell.

The second SRAM cell has a substantially similar structure to the first SRAM except for the number of fins for the pass-gate FinFETs and pull-down FinFETs.

The second SRAM cell includes a third pass-gate FinFET PG3, a fourth pass-gate FinFET PG4, a third first-conductivity-type (a third pull-up) FinFET PU3, a third second-conductivity-type (a third pull-down) FinFET PD3, a fourth first-conductivity-type (a fourth pull-up) FinFET PU4 and a fourth second-conductivity-type (a fourth pull-down) FinFET PD4.

The third pass-gate FinFET PG3 is constituted by a seventh fin structure F7 and a fifth gate structure GA5 as shown in FIG. 1B. The third pull-down FinFET PD3 is constituted by the seventh fin structure F7 and a sixth gate structure GA6. The third pull-up FinFET PU3 is constituted by an eighth fin structure F8 and the sixth gate structure GA6.

The fourth pass-gate FinFET PG4 is constituted by a ninth fin structure F9 and a seventh gate structure GA7. The fourth pull-down FinFET PD4 is constituted by the ninth fin structure F9 and an eighth gate structure GA8. The fourth pull-up FinFET PU4 is constituted by a tenth fin structure F10 and the eighth gate structure GA8.

Still referring to FIG. 1B, the drains of the FinFETs PG3, PD3 and PU3 are electrically connected by a tenth bar contact MD10, which functions as a data storage node, and the drains of the FinFETs PG4, PD4 and PU4 are electrically connected by a fourteenth bar contact MD14, which functions as the complementary data storage node. The tenth bar contact MD10 is formed over the common drain regions of the seventh fin structure F7 of the FinFETs PG3 and PD3 and the drain region of the eighth fin structure F8 of the FinFET PU3. The fourteenth bar contact MD14 is formed over the common drain regions of the ninth fin structure F9 of the FinFETs PG4 and PD4 and the drain region of the tenth fin structure F10 of the FinFET PU4.

A ninth bar contact MD9 is formed over the source region of the seventh fin structure F7 of the FinFET PG3, an eleventh bar contact MD11 is formed over the source region of the seventh fin structure F7 of the FinFET PD3, and a twelfth bar contact MD12 is formed over the source region of the eighth fin structure F8 of the FinFET PU3. A thirteenth bar contact MD13 is formed over the source region of the ninth fin structure F9 of the FinFET PG4, a fifteenth bar contact MD15 is formed over the source region of the ninth fin structure F9 of the FinFET PD4, and a sixteenth bar contact MD16 is formed over the source region of the tenth fin structure F10 of the FinFET PU4.

The gate electrodes of the third and fourth pass-gate FinFETs PG3, PG4 are coupled to a second word line, the ninth bar contact MD9 is coupled to a second bit line, and the thirteenth bar contact MD13 is coupled to a second complementary bit line. The eleventh bar contact MD11 and the fifteenth bar contact MD15 are coupled to the first potential, and the twelfth bar contact MD12 and the sixteenth bar contact MD16 are coupled to the second potential.

FIGS. 2-13 show exemplary cross sectional views of various stages of manufacturing operations of the first SRAM cell including FinFETs according to one embodiment of the present disclosure. It is understood that additional operations can be provided before, during, and after the processes shown by FIGS. 2-13, and some of the operations described below can be replaced or eliminated, for additional embodiments of the method. The order of the operations/processes may be interchangeable.

To fabricate fin structures for the FinFET device, a mask layer 11 is formed over a substrate 10. The mask layer 11 is formed by, for example, a thermal oxidation process and/or a chemical vapor deposition (CVD) process. The substrate 10 is, for example, a p-type silicon or germanium substrate with an impurity concentration in a range from about $1 \times 10^{15}$ cm$^{-3}$ to about $1 \times 10^{16}$ cm$^{-3}$. In other embodiments, the substrate is an n-type silicon or germanium substrate with an impurity concentration in a range from about $1 \times 10^{15}$ cm$^{-3}$ to about $1 \times 10^{16}$ cm$^{-3}$.

Alternatively, the substrate 10 may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The mask layer 11 includes, for example, a pad oxide (e.g., silicon oxide) layer 12 and a silicon nitride mask layer 13 in some embodiments.

The pad oxide layer 12 may be formed by using thermal oxidation or a CVD process. The silicon nitride mask layer 13 may be formed by a physical vapor deposition (PVD), such as a sputtering method, a CVD, plasma-enhanced chemical vapor deposition (PECVD), an atmospheric pressure chemical vapor deposition (APCVD), a low-pressure CVD (LPCVD), a high density plasma CVD (HDPCVD), an atomic layer deposition (ALD), and/or other processes.

The thickness of the pad oxide layer 12 is in a range from about 2 nm to about 15 nm and the thickness of the silicon nitride mask layer 13 is in a range from about 2 nm to about 50 nm in some embodiments. A mask pattern is further formed over the mask layer. The mask pattern is, for example, a resist pattern formed by lithography operations.

Figure 3:
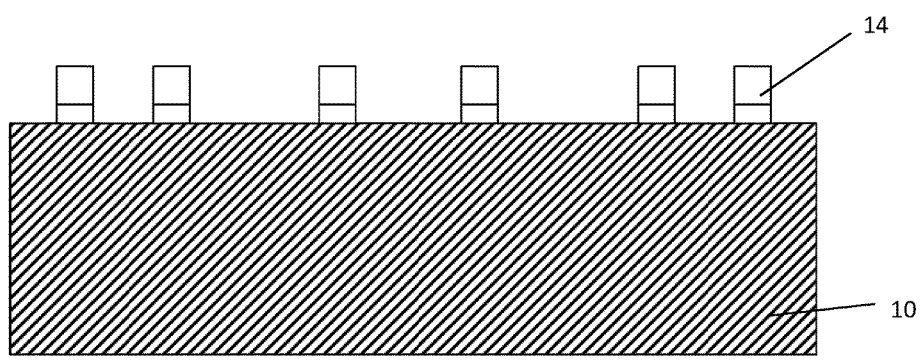

By using the mask pattern as an etching mask, hard mask patterns 14 of the pad oxide layer and the silicon nitride mask layer is formed, as shown in FIG. 3. FIG. 3 corresponds to the line X1-X1 of FIG. 1A.

Figure 4:
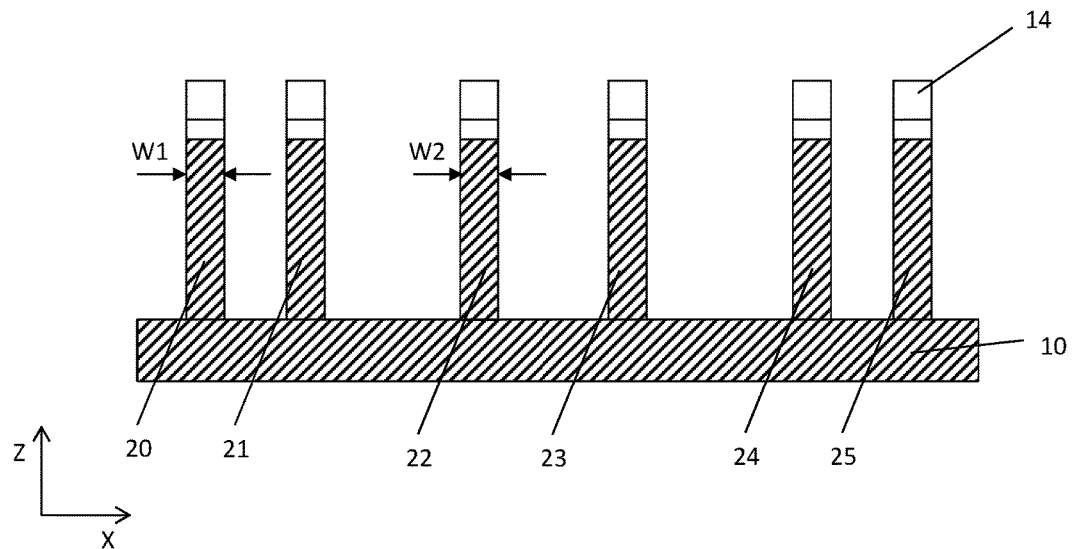

Then, as shown in FIG. 4, by using the hard mask patterns 14 as an etching mask, the substrate 10 is patterned into fin structures 20-25 by trench etching using a dry etching method and/or a wet etching method. FIG. 4 corresponds to the line X1-X1 of FIG. 1A, and the fin structures 20-25 correspond to the fin structures F1, F2, F3, F6, F5 and F4, respectively.

The fin structures may be made of the same material as the substrate 10 and may continuously extend from the substrate 10. In this embodiment, the fin structures are made of Si. The silicon layer of the fin structures may be intrinsic, or appropriately doped with an n-type impurity or a p-type impurity.

The widths of the fin structures are in a range from about 5 nm to about 40 nm in some embodiments. The first widths W1 of the fin structures 20, 21, 24 and 25 in the X direction are substantially the same as the second widths W2 of the fin structures 22 and 23 in the X direction. The first width and the second width are measured at the center of channel layers which are an upper part of the fin structures to be covered by a gate structure.

The height (along the Z direction) of the fin structures is in a range from about 100 nm to about 300 nm in some embodiments, and is in a range from about 50 nm to 100 nm in other embodiments.

After the fin structures 20-25 are formed, the isolation insulating layer 30 is formed in spaces between the fin structures and/or a space between one fin structure and another element formed over the substrate 10. The isolation insulating layer 30 may also be called a "shallow-trench-isolation (STI)" layer. The insulating material for the isolation insulating layer 30 may include one or more layers of silicon oxide, silicon nitride, silicon oxynitride (SiON), SiOCN, fluorine-doped silicate glass (FSG), or a low-k dielectric material. The isolation insulating layer is formed by LPCVD (low pressure chemical vapor deposition), plasma-CVD or flowable CVD. In the flowable CVD, flowable dielectric materials instead of silicon oxide may be deposited. Flowable dielectric materials, as their name suggest, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove undesired element(s) to form silicon oxide. When the undesired element(s) is removed, the flowable film densifies and shrinks. In some embodiments, multiple anneal processes are conducted. The flowable film is cured and annealed more than once. The flowable film may be doped with boron and/or phosphorous.

Figure 5:
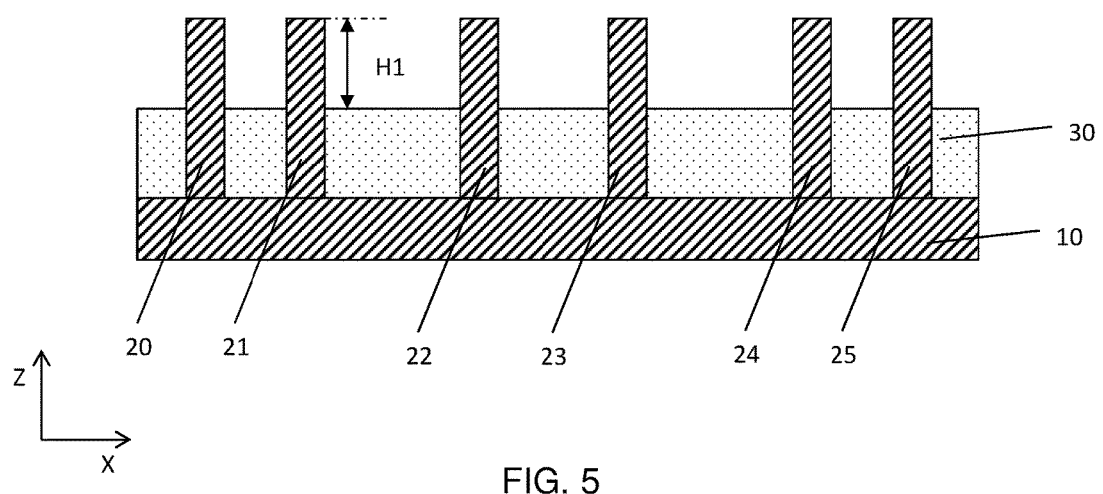

The isolation insulating layer 30 is first formed in a thick layer so that the fin structures are embedded in the thick layer, and the thick layer is recessed so as to expose the upper portions of the fin structures 20, as shown in FIG. 5. The mask patterns 14 are removed during recessing the isolation insulating layer 30.

The height H1 of the fin structures from the upper surface of the isolation insulating layer 30 is in a range from about 20 nm to about 100 nm in some embodiments, and is in a range from about 30 nm to about 50 nm in other embodiments. After or before recessing the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range from about 900° C. to about 1050° C. for about 1.5 seconds to about 10 seconds in an inert gas ambient, such as an $N_2$, Ar or He ambient.

Figure 6A:
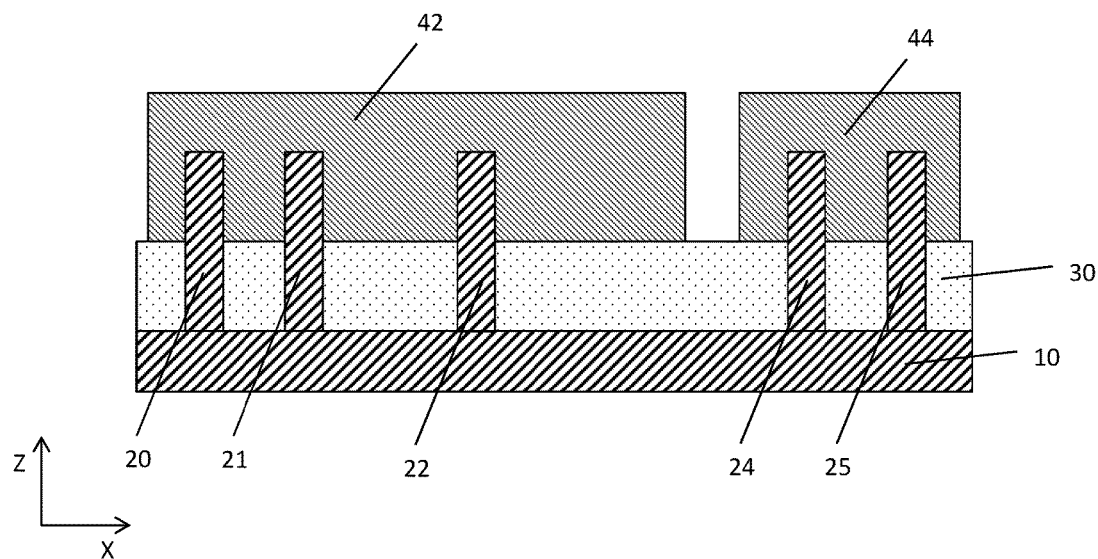
Figure 6B:
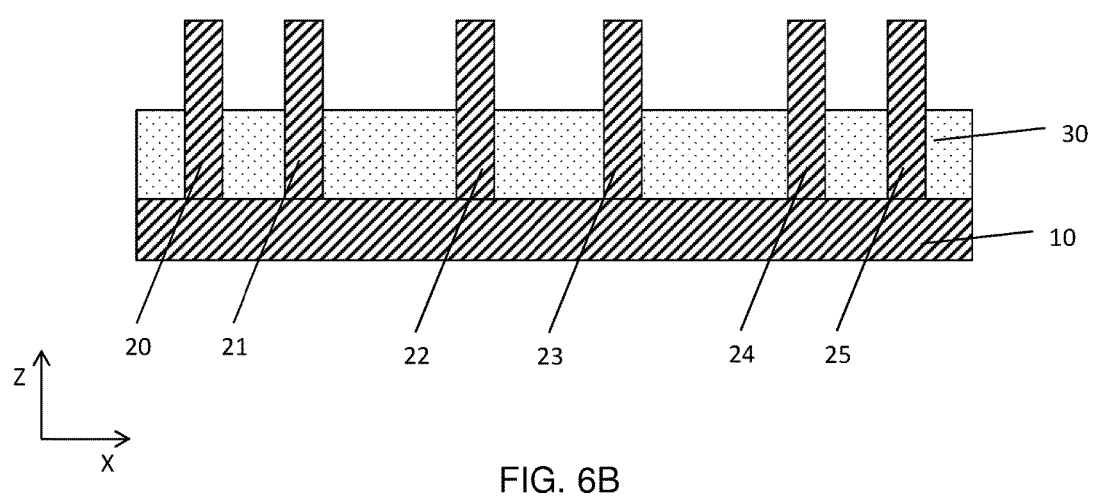

After the isolation insulating layer 30 is formed, gate structures 42 and 44 are formed over the fin structures 20-22 and 24-25, respectively, as shown in FIG. 6A. FIG. 6A corresponds to the line X2-X2 of FIG. 1A and FIG. 6B corresponds to the line X1-X1 of FIG. 1A.

As shown in FIG. 6A, the gate structures 42 and 44 extend in the X direction, while the fin structures 20-22, 24 and 25 extend in the Y direction. The gate structure 42 corresponds to the gate structure GA2 of FIG. 1A, and the gate structure 44 corresponds to the gate structure GA3 of FIG. 1A. In some embodiments, the fin structure 23 is also located under the gate structure 42.

To fabricate the gate structures 42 and 44, a dielectric layer and a poly silicon layer are formed over the isolation insulating layer 30 and the exposed fin structures, and then patterning operations are performed so as to obtain gate structures including a gate pattern made of poly silicon and a dielectric layer. In some embodiments, the polysilicon layer is patterned by using a hard mask and the hard mask remains on the gate pattern. The hard mask includes one or more layers of insulating material.

In some embodiments, the dielectric layer 42 may include one or more layers of silicon oxide, silicon nitride, silicon oxy-nitride, or high-k dielectrics. In some embodiments, a thickness of the dielectric layer 42 is in a range from about 2 nm to about 20 nm, and in a range from about 2 nm to about 10 nm in other embodiments. The polysilicon layer is formed by CVD in some embodiments.

In some embodiments, a gate replacement technology is employed. In such a case, the gate structures are dummy gate structures, which are subsequently removed.

Further, sidewall spacers (not shown) are formed on both sidewalls of the gate structures and the exposed fin structures. The sidewall spacers include one or more layers of insulating material, such as $SiO_2$, SiN, SiON, SiOCN or SiCN, which are formed by CVD, PVD, ALD, e-beam evaporation, or other suitable process. A low-k dielectric material may be used as the sidewall spacers. The sidewall spacers are formed by forming a blanket layer of insulating material and performing anisotropic etching. In one embodiment, the sidewall spacer layers are made of silicon nitride based material, such as SiN, SiON, SiOCN or SiCN.

Figure 7:
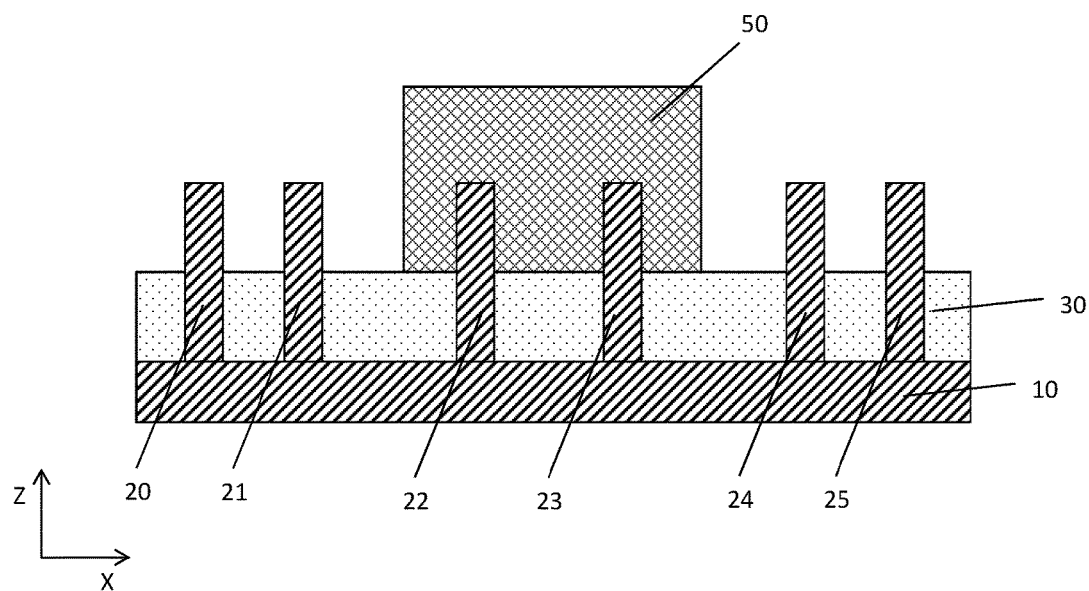

Then, as shown in FIG. 7, the fin structures 22 and 23 are covered by a first protective layer 50. The first protective layer 50 is made of dielectric material including a silicon nitride based material, such as SiN, SiON, SiOCN or SiCN. In one embodiment, SiN is used as the first protective layer 50. The first protective layer 50 is formed by depositing an insulating film by CVD, PVD, ALD, e-beam evaporation, or other suitable process, and patterning the insulating film by using a lithography process and an etching process.

Figure 8:
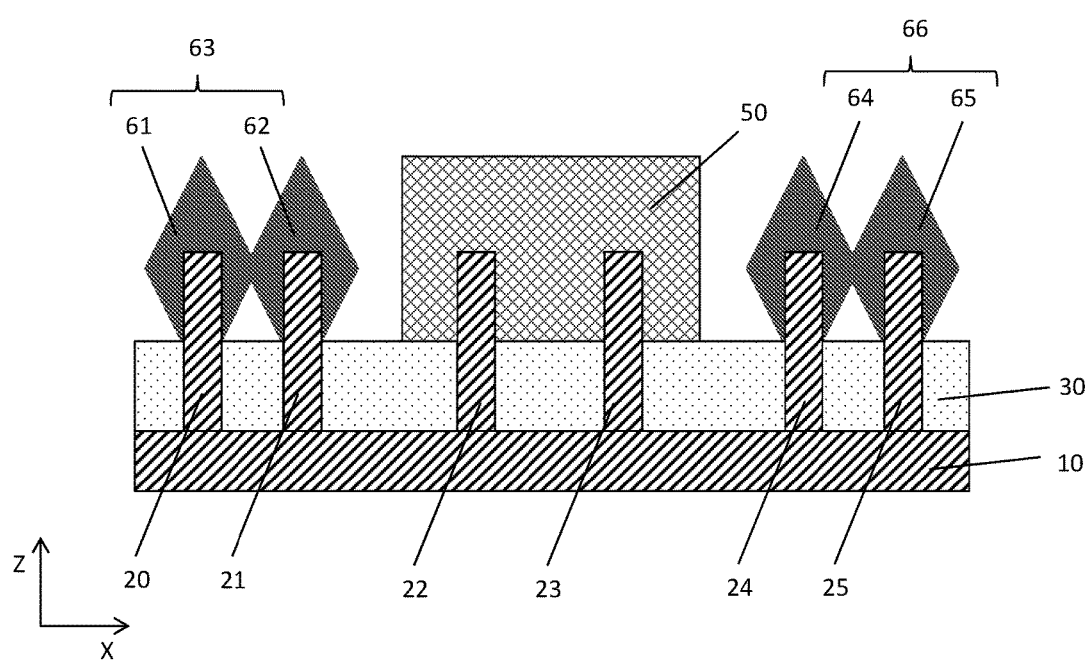
Figure 9:
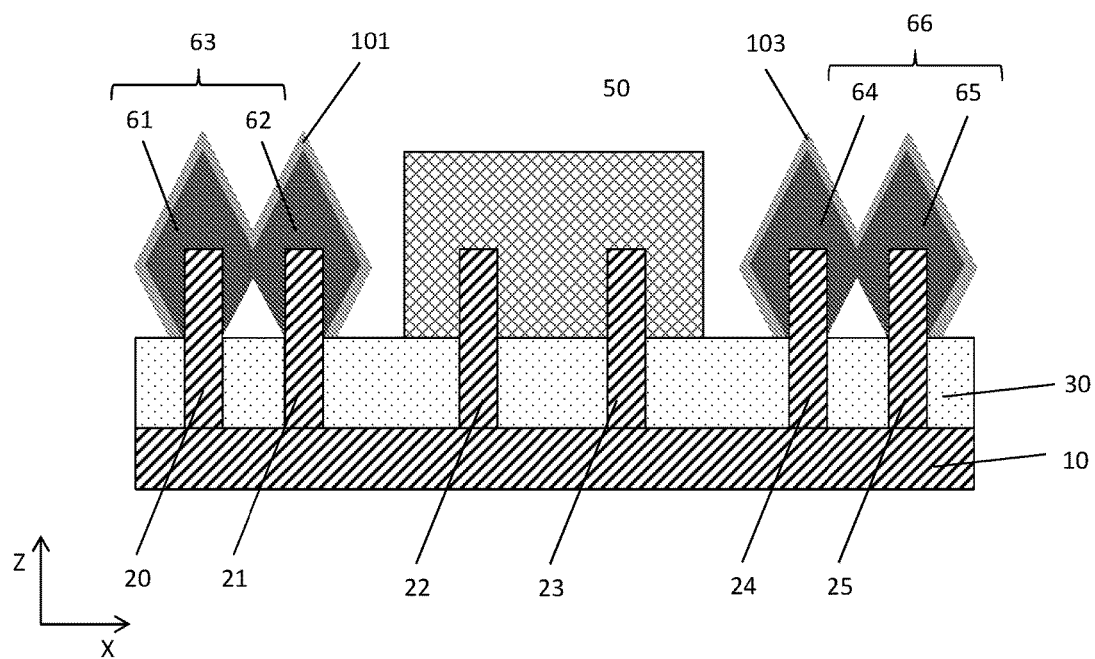

Then, as shown in FIG. 8, first epitaxial source/drain structures 61, 62, 64 and 65 are formed over the fin structures 20, 21, 24 and 25, respectively. In some embodiments, as shown in FIG. 9, the first epitaxial source/drain structures 61 and 62 are merged into a merged epitaxial S/D structure 63, and the first epitaxial S/D structures 64 and 65 are merged into a merged epitaxial S/D structure 66. In one embodiment of the present disclosure, the merged epitaxial S/D structures 63 and 66 include a void. In other embodiments, the first epitaxial source/drain structures 61 and 62 or the first epitaxial S/D structures 64 and 65 are not merged into a merged epitaxial S/D structure.

The first epitaxial S/D structures are made of one or more layers of semiconductor material having a different lattice constant than the fin structures (channel regions). When the fin structures are made of Si, the first epitaxial S/D structures 61, 62, 64 and 65 include SiP, SiC or SiCP for an n-type FinFET. In this embodiment SiP is used. The content of P (phosphorous) in the SiP layer is in a range from about 5 atomic % to about 20 atomic % in some embodiments, and is in a range from about 10 atomic % to about 15 atomic % in other embodiments. The epitaxial source/drain structures are epitaxially formed over the upper portions of the fin structures, and thus have a crystalline structure. Due to the crystal orientation of the substrate formed into the fin structures (e.g., (100) plane), the first epitaxial source/drain structures 61, 62, 64 and 65 grow laterally and have a diamond-like shape.

After the first epitaxial source/drain structures are formed, cap epitaxial layers 101, 103 are formed on the first epitaxial source/drain structures 63, 66, as shown in FIG. 9. The cap epitaxial layers 101, 103 include SiC or SiCP for an n-type FinFET. In this embodiment, SiC is used. The content of C (carbon) in the SiC (or SiCP) layer is in a range from about 0.5 atomic % to about 5 atomic % in some embodiments, and is in a range from about 1 atomic % to about 3 atomic % in other embodiments. The thickness of the cap epitaxial layers 101, 103 is in a range from about 0.5 nm to about 5 nm in some embodiments, and is in a range from about 1 nm to about 3 nm in other embodiments.

The first epitaxial source/drain structures and the cap epitaxial layers may be grown at a temperature of about 600 to 800° C. under a pressure of about 80 to 150 Torr, by using a Si containing gas such as $SiH_4$, $Si_2H_6$ or $SiCl_2H_2$, a C containing gas, such as $CH_4$ or $C_2H_6$, and/or a dopant gas, such as $PH_3$.

Figure 10:
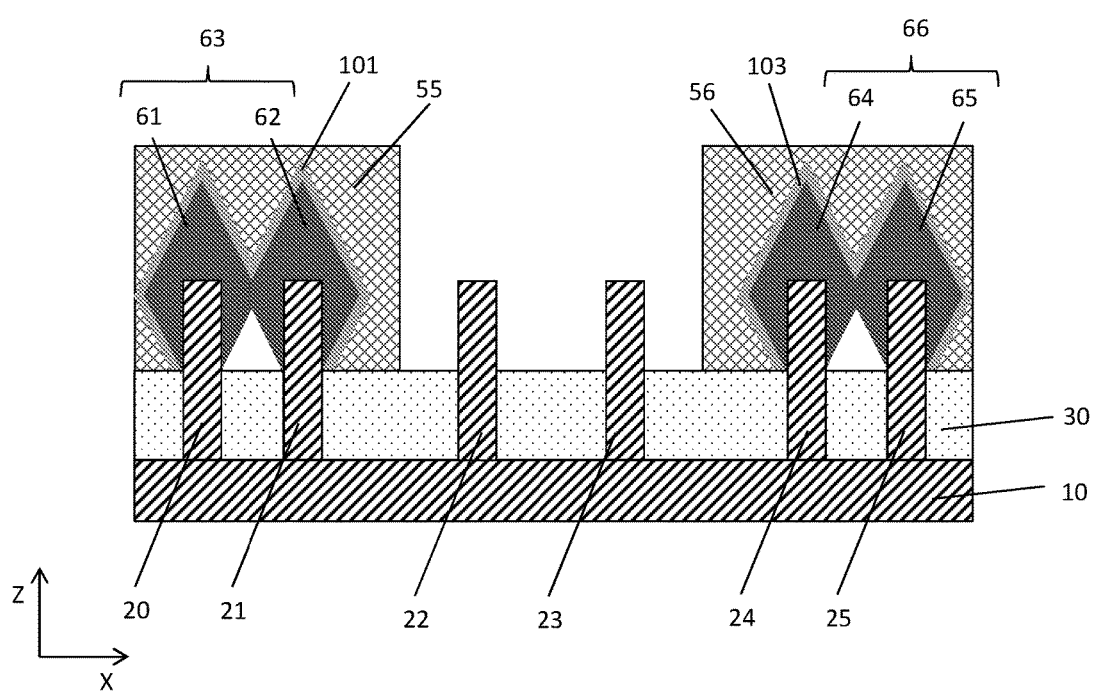

After forming the cap epitaxial layers 101 and 103, the first protective layer 50 is removed and the merged epitaxial S/D structures 63 and 66 covered with the cap epitaxial layers 101, 103 are covered by second protective layers 55, 56 as shown in FIG. 10. The second protective layers 55, 56 are made of a similar material as the first protective layer 50.

The second protective layer 55, 56 are formed by forming a dielectric (e.g., SiN) layer after or without removing the first protective layer 50, and a patterning operation including a photolithography and an etching process is performed to open the dielectric layer deposited over the p-channel region including the fin structures 22 and 23.

Figure 11:
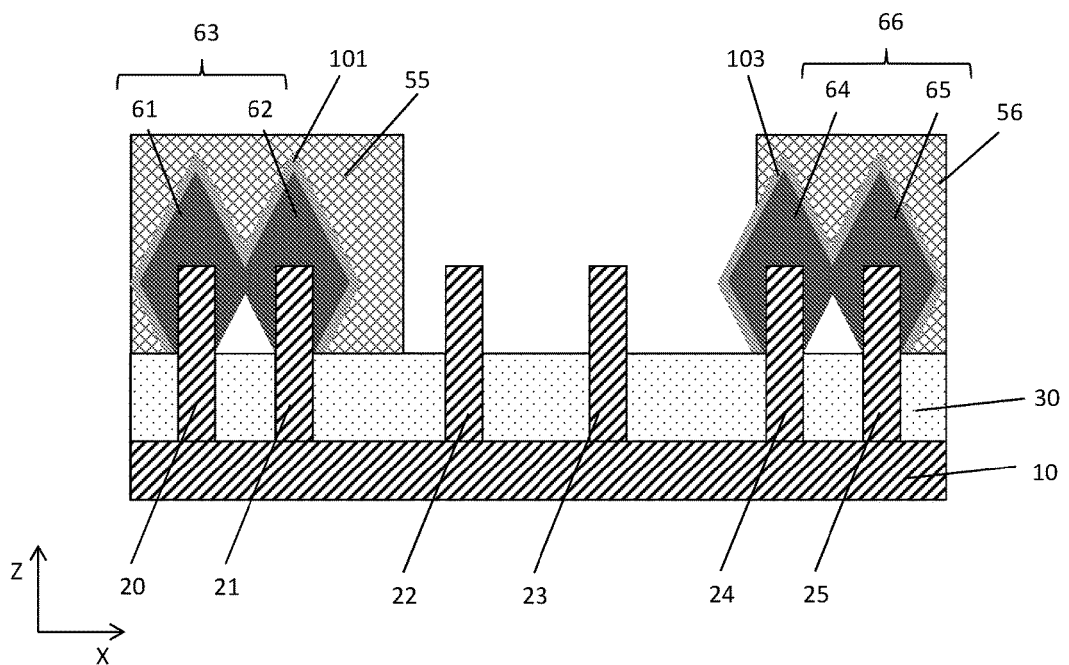

FIG. 10 shows an example, in which a mask alignment in the photolithography process is performed with a substantially no mask alignment error. However, in some embodiments, the mask alignment error in the photolithography process causes a part of the cap epitaxial layer 103 formed over the fin structure 24 to be exposed from the second protective layer 56, as shown in FIG. 11. In particular, when the distance between the fin structure 23 for the p-channel FET and the fin structure 24 for the n-channel FET becomes smaller, it becomes more probable that mask alignment error will result in exposure of the cap epitaxial layer (i.e., a part of the S/D structure for the n-channel FET) from the second protective layer.

After forming the second protective layers 55, 56, second epitaxial source/drain structures 72 and 74 are formed over the fin structures 22 and 23, respectively. In some embodiments, as shown in FIG. 11, the second epitaxial source/drain structures 72 and 74 are not merged. In other embodiments, the second epitaxial source/drain structures 72 and 74 are not merged into a merged epitaxial S/D structure including a void.

The second epitaxial S/D structures are made of one or more layers of semiconductor material having a different lattice constant than the fin structures (channel regions). When the fin structures are made of Si, the second epitaxial S/D structures 72 and 74 include SiGe or Ge for a p-type FinFET. The concentration of Ge in SiGe is in a range from about 10 atomic % to about 90 atomic % in some embodiments, and is in a range from about 30 atomic % to about 60 atomic % in other embodiments. The second epitaxial source/drain structures are epitaxially formed over the upper portions of the structures, and thus have a crystalline structure. Due to the crystal orientation of the substrate formed into the fin structures (e.g., (100) plane), the second epitaxial source/drain structures 72 and 74 grow laterally and have a diamond-like shape.

The second epitaxial source/drain structures may be grown at a temperature of about 600 to 800° C. under a pressure of about 80 to 150 Torr, using a Si containing gas such as $SiH_4$, $Si_2H_6$ or $SiCl_2H_2$, and/or a Ge containing gas, such as $GeH_4$, $Ge_2H_6$ or $GeCl_2H_2$.

Figure 12:
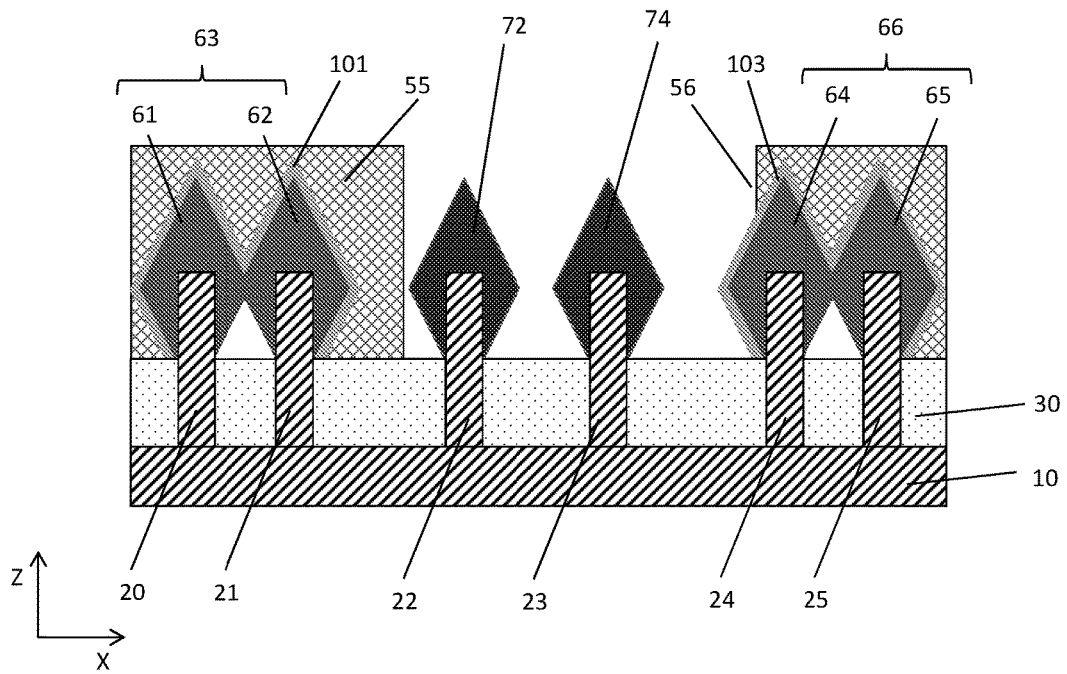
Figure 13:
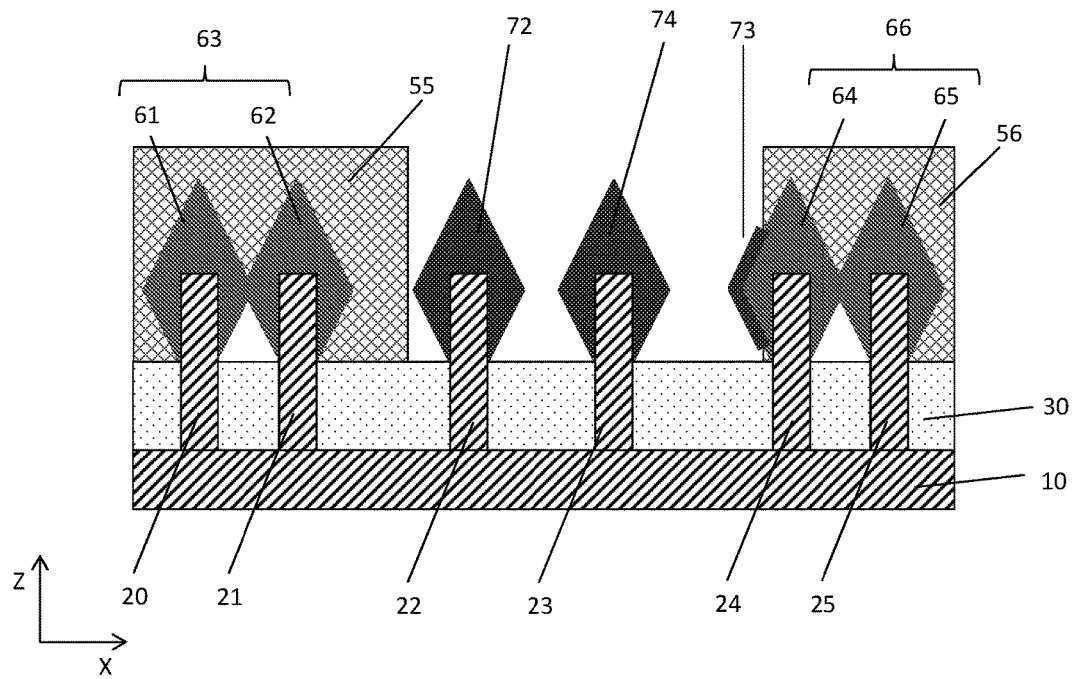

As shown in FIG. 12, the part of the cap epitaxial layer 103 made of SiC is exposed to the source gas containing Ge for growing the second epitaxial S/D structures. However, Ge or SiGe is not deposited on the surface of SiC. In some embodiments, a slight amount of Ge remains, but the amount of Ge measured by Secondary Ion Mass Spectroscopy (SIMS) is less than $10 \times 10^{14}$ atoms/cm$^3$. If the surface of the first epitaxial S/D structure 64 is not covered by the SiC cap epitaxial layer, a layer of Ge or SiGe is formed over the SiP first epitaxial S/D structure 64 as shown in FIG. 13, which causes an extra junction capacitance or a defect noise in the n-channel FET.

After the second epitaxial S/D structures are formed, the second protective layer 55 is removed by, for example, wet etching, and a first interlayer dielectric (ILD) layer 80 is formed over the merged epitaxial S/D structures 63 and 66 covered with the cap epitaxial layers 101, 103 and the second epitaxial S/D structures 72 and 74.

The first ILD layer 80 includes one or more layers of insulating material, such as $SiO_2$, SiON or SiOC, or a low-k dielectric material. In one embodiment, $SiO_2$ is used as the first ILD layer 80. In some embodiments, a contact etch-stop layer (not shown), which includes one or more layers of insulating material, such as SiN, SiON, SiOCN or SiCN, is formed before forming the first ILD layer 80.

Figure 14:
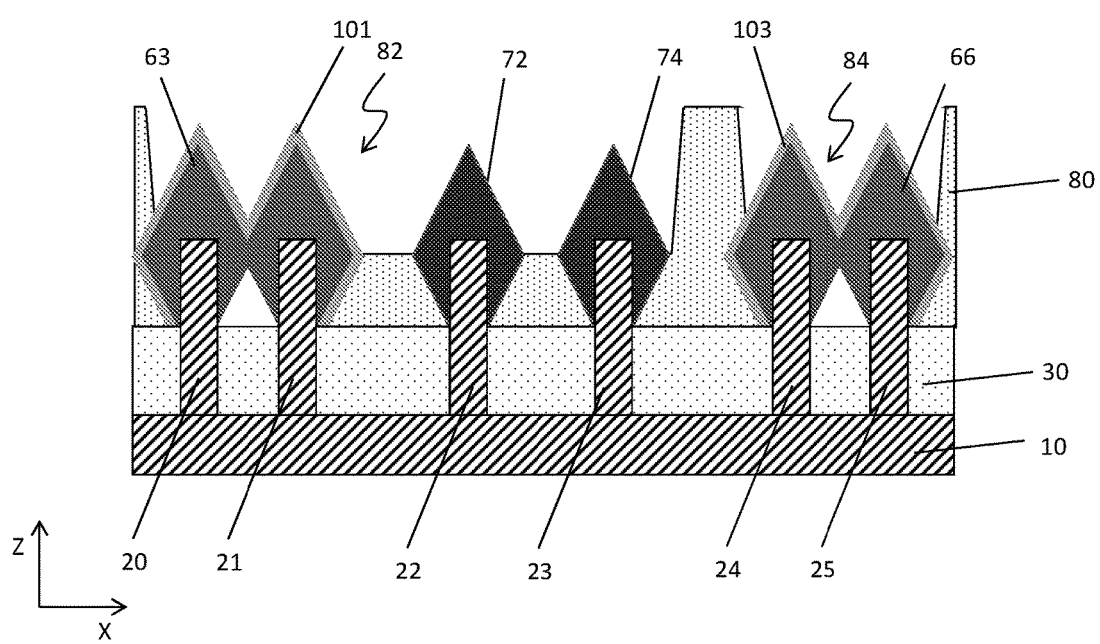

Then, by using a lithography operation and an etching operation, contact openings 82 and 84 are formed in the first ILD layer 80, as shown in FIG. 14.

Figure 15:
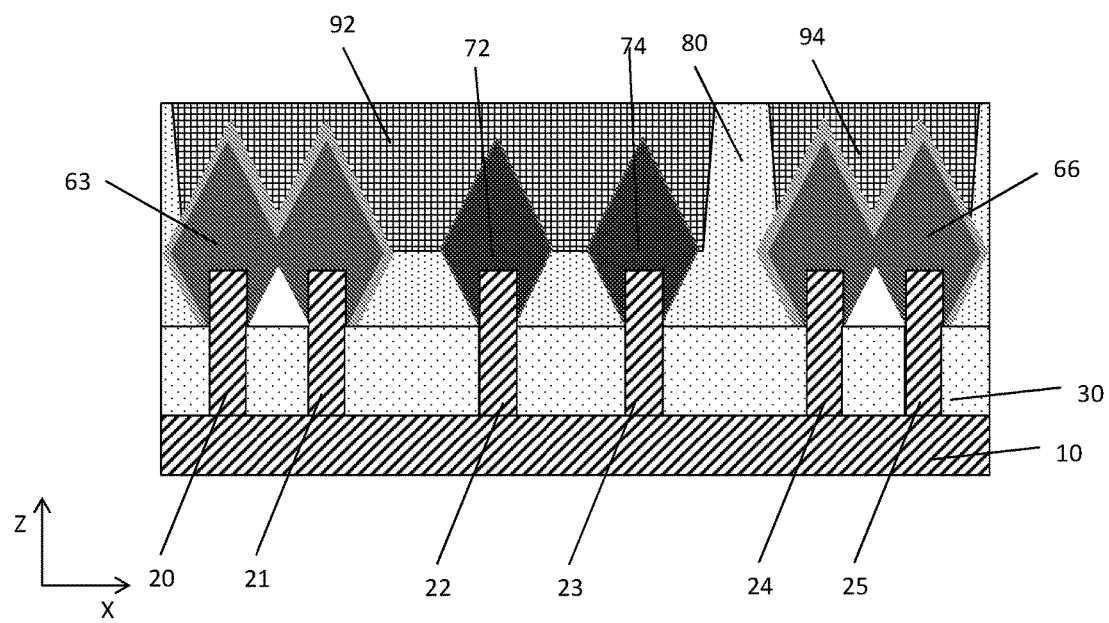

Subsequently, the contact openings 82 and 84 are filled with a conductive material, thereby forming bar contacts 92 and 94, as shown in FIG. 15. The bar contacts 92 and 94 corresponds to the bar contacts MD2 and MD6 of FIG. 1A, respectively. The bar contacts 92 and 94 are formed by forming a thick conductive material layer over the structure of FIG. 14 and performing a planarization operation, such as an etch-back process and a CMP process. The bar contacts may include a single layer or multiple layers of any suitable metal such as Co, W, Ti, Ta, Cu, Al and/or Ni and/or nitride thereof. Further, in some embodiments, before the conductive material is formed in the contact openings, a silicide layer is formed over the first and second epitaxial S/D structures, if not formed before forming the first ILD layer 80.

In some embodiments, a metal gate structure (not shown) is formed by a gate replacement technology after forming the first ILD 80 and before forming the contact openings 82 and 84. In some embodiments, a silicide layer is formed over the cap insulating layers 101, 103 and/or the second epitaxial S/D structures 72, 74. The silicide layer may include one or more of WSi, TiSi, TaSi, CoSi, MoSi and NiSi. The silicide layer may be formed after the openings 82, 84 are formed or before the first ILD layer 80 is formed.

After forming the bar contacts 92 and 94, further CMOS processes are performed to form various features such as additional interlayer dielectric layer, contacts/vias, interconnect metal layers, and passivation layers, etc.

Figure 16:
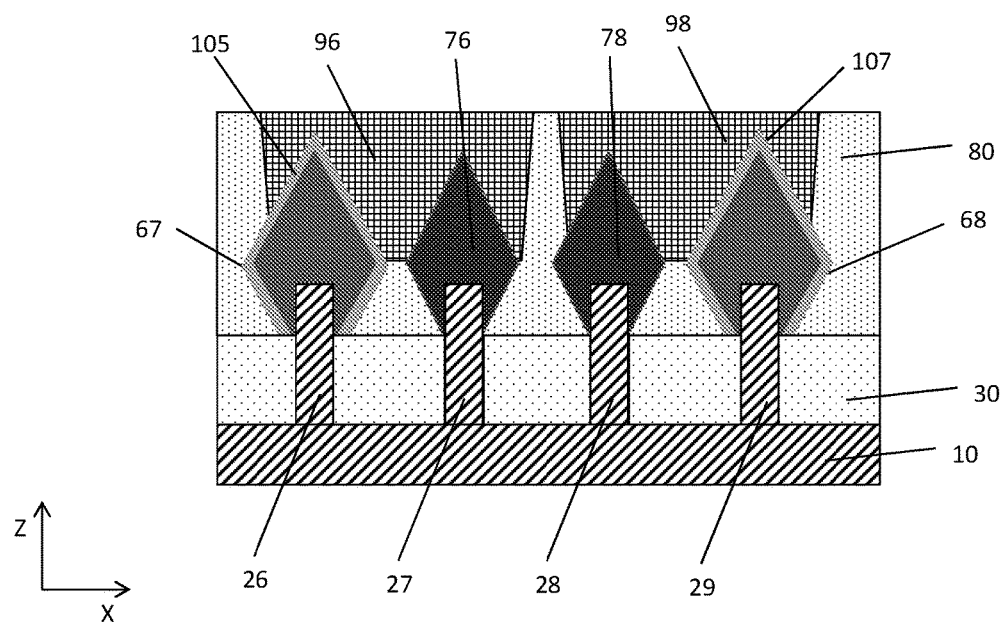
FIG. 16 shows an exemplary cross sectional view of a second SRAM cell according to one embodiment of the present disclosure.

FIG. 16 show an exemplary cross sectional views of a second SRAM cell according to one embodiment of the present disclosure. FIG. 16 corresponds to the line X3-X3 of FIG. 1B after bar contacts 96 and 98 are formed. The fin structures 26, 27, 28 and 29 correspond to the fin structures F7, F8, F9 and F10 of FIG. 1B, respectively, and the bar contacts 96 and 98 correspond to the bar contact MD10 and MD14 of FIG. 1B, respectively.

The structure of FIG. 16 for the second SRAM cell can be manufactured by substantially similar operations as the manufacturing of the structure of FIG. 15 for the first SRAM cell.

In FIG. 16, the third epitaxial S/D structures 67 and 68 are formed over the fin structures 26 and 29, respectively, for n-type FinFETs, and the fourth epitaxial S/D structures 76 and 78 are formed over the fin structures 27 and 28, respectively, for p-type FinFETs. Cap epitaxial layers 105, 107 are formed over the third epitaxial S/D structures 67 and 68.

The third epitaxial S/D structures are formed at the same time as the first epitaxial S/D structures of the previous embodiments, and the fourth epitaxial S/D structures are formed at the same time as the second epitaxial S/D structures of the previous embodiments. The cap epitaxial layers 105, 107 are formed at the same time as the cap epitaxial layers 101, 103 of the previous embodiments After forming the bar contacts 96 and 98, further CMOS processes are performed to form various features such as additional interlayer dielectric layer, contacts/vias, interconnect metal layers, and passivation layers, etc.

Figure 17:
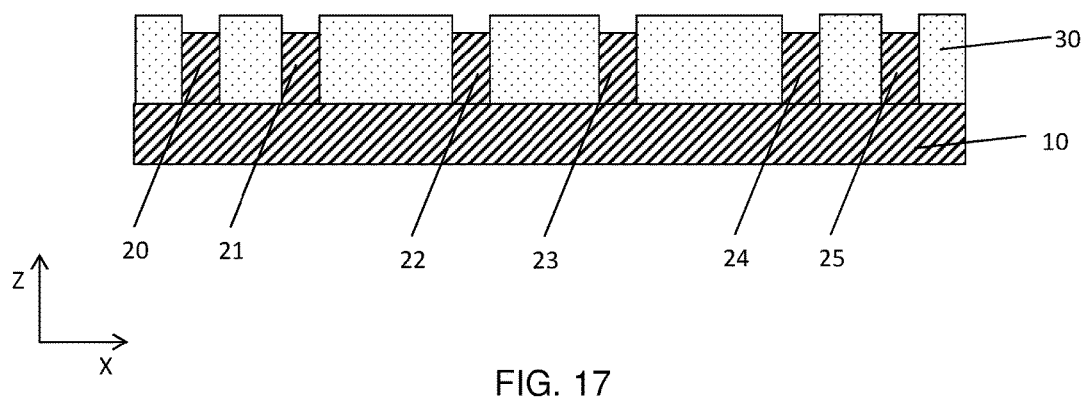
FIGS. 17 and 18 show exemplary cross sectional views of various stages of manufacturing operations according to another embodiment of the present disclosure.
Figure 18:
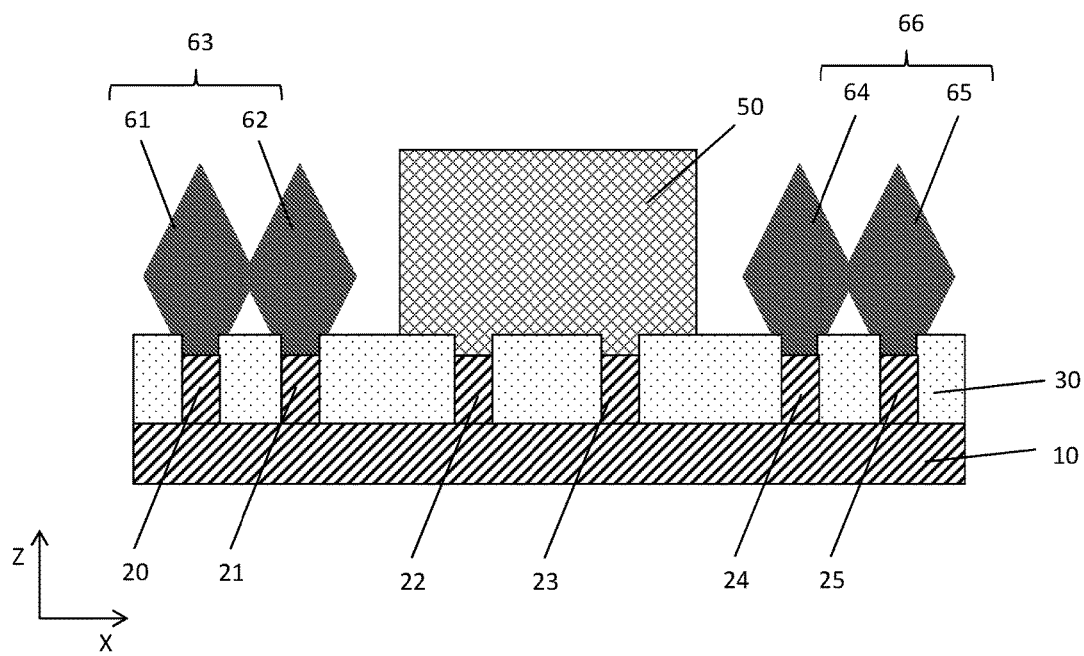

FIGS. 17 and 18 shows exemplary cross sectional views of various stages of manufacturing operations according to another embodiment of the present disclosure. In this embodiment, after the gate structures 42 and 44 are formed as shown in FIGS, 6A and 6B, the upper portions of the fin structures 20-25 are recessed (etched) down to the level equal to or below the upper surface of the isolation insulating layer 30, as shown in FIG. 17. In other embodiments, the recessed upper portions of the fin structures 20-25 are located at a level above the upper surface of the isolation insulating layer 30.

After the fin structures 20-25 are recessed, the region for the p-channel FET including the fin structures 22 and 23 is covered by the first protective layer 50, and the first epitaxial S/D structures 61-65 are formed as shown in FIG. 18.

In some embodiments, the recess etching of the fin structures 20, 21, 24 and 25 for the n-channel FETs is separately performed from the recess etching of the fin structures 22, 23 for the p-channel FETs. In certain embodiments, after the first epitaxial S/D structures and the cap epitaxial layers are formed, the fin structures 22, 23 for the p-channel FETs are recessed and the second epitaxial S/D structures are formed. The amount of the recess etching may be the same or different between the fin structures 20, 21, 24 and 25 and the fin structures 22 and 23.

Figure 19:
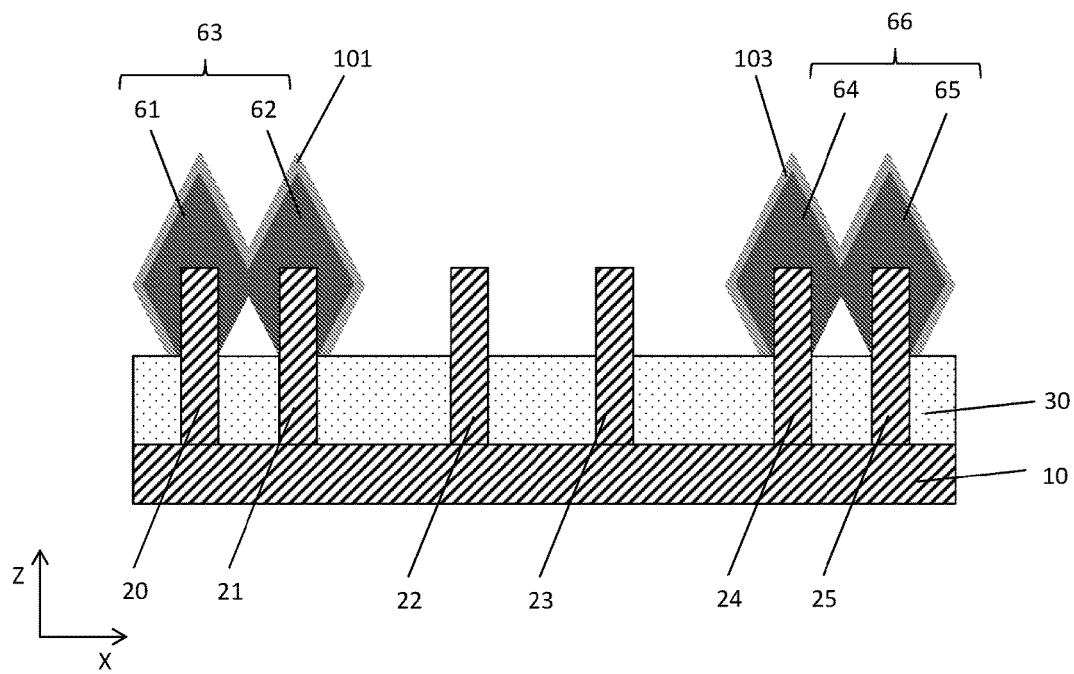
FIGS. 19 and 20 show exemplary cross sectional views of various stages of manufacturing operations according to another embodiment of the present disclosure.
Figure 20:
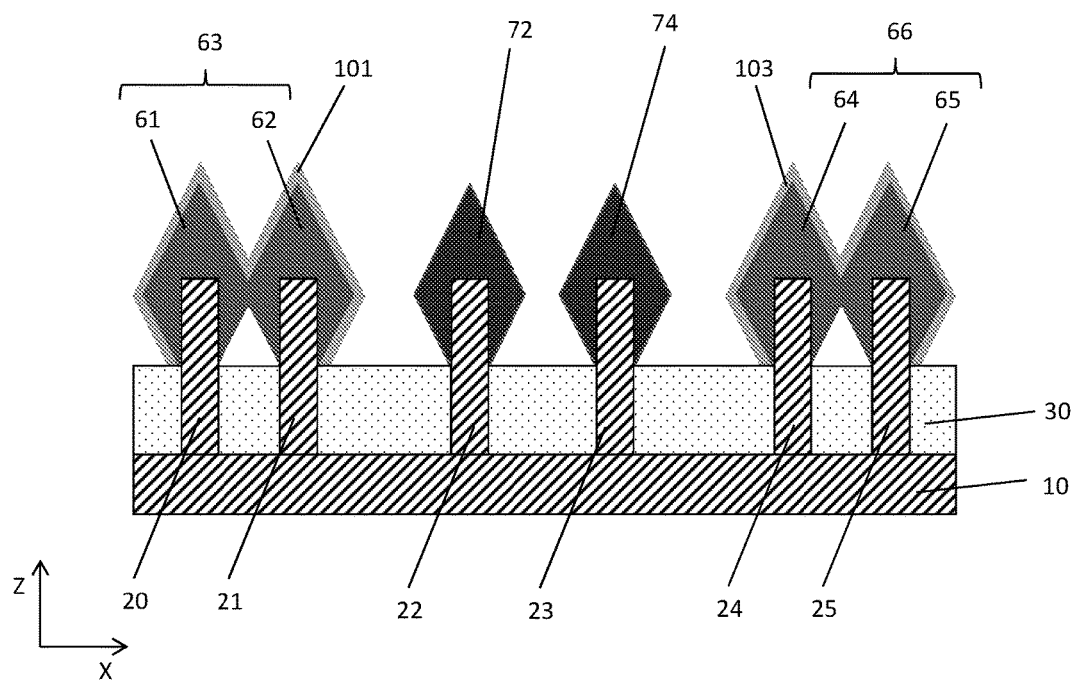

FIGS. 19 and 20 show exemplary cross sectional views of various stages of manufacturing operations according to another embodiment of the present disclosure.

In the foregoing embodiments, the merged epitaxial S/D structures 63 and 66 covered with the cap epitaxial layers 101, 103 are covered by the second protective layers 55, 56 during the epitaxial growth of the second epitaxial S/D structure. In this embodiment, however, the merged epitaxial S/D structures 63 and 66 covered with the cap epitaxial layers 101, 103 are not covered by the second protective layers 55, 56 during the epitaxial growth of the second epitaxial S/D structure. As shown in FIG. 19, after the cap epitaxial layers 101, 103 are formed, the first protective layer 50 is removed. Then, without using the second protective layers 55, 56, the epitaxial growth of the second epitaxial S/D structure 72, 74 is performed as shown in FIG. 20. As set forth above, Ge or SiGe is not formed over the SiC cap epitaxial layers 101, 103.

In the foregoing embodiments, the manufacturing operations and structures for the first SRAM cell and the second SRAM cell are described. However, the manufacturing operations and structures as described above can be applied to other semiconductor circuits, such as a logic circuit, where a p-channel FET and an n-channel FET are arranged close to each other.

In the present disclosure, since the first epitaxial S/D structures made of, e.g., SiP, are covered by the cap epitaxial layer made of, e.g., SiC, even if a part of the first epitaxial S/D structures is exposed from the first protective layer due to a mask alignment error, no Ge or SiGe is deposited on the SiC cap epitaxial layers. Accordingly, it is possible to avoid extra junction capacitance caused by a Ge or SiGe layer or to reduce a defect noise in the n-channel FET. Further, it is also possible to reduce the distance between a p-channel FET and an n-channel FET.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a first fin structure for an n-channel fin field effect transistor (FinFET) is formed over a substrate. An isolation insulating layer is formed over the substrate such that an upper portion of the first fin structure protrudes from the isolation insulating layer. A gate structure is formed over a part of the upper portion of the first fin structure. A first source/drain (S/D) epitaxial layer is formed over the first fin structure not covered by the gate structure. A cap epitaxial layer is formed over the first S/D epitaxial layer. The first S/D epitaxial layer includes SiP, and the cap epitaxial layer includes SiC with a carbon concentration in a range from 0.5 atomic % to 5 atomic %.

In accordance with another aspect of the present disclosure, in a method of manufacturing a semiconductor device, a first fin structure for an n-channel fin field effect transistor (FinFET) and a second fin structure for a p-channel FinFET are formed over a substrate. An isolation insulating layer is formed over the substrate such that an upper portion of the first fin structure and an upper portion of the second fin structure protrude from the isolation insulating layer. A first gate structure is formed over a part of the upper portion of the first fin structure, and a second gate structure is formed over a part of the upper portion of the second fin structure. A first source/drain (S/D) epitaxial layer is formed over the first fin structure not covered by the first gate structure. A cap epitaxial layer is formed over the first S/D epitaxial layer. A second S/D epitaxial layer is formed over the second fin structure not covered by the second gate structure. The first S/D epitaxial layer includes SiP, and the cap epitaxial layer includes SiC with a carbon concentration being in a range from 0.5 atomic % to 5 atomic %.

In accordance with another aspect of the present disclosure, a semiconductor device includes a first fin structure disposed over a substrate, an isolation insulating layer disposed over the substrate such that an upper portion of the first fin structure protrudes from the isolation insulating layer, a gate structure disposed over a part of the upper portion of the first fin structure, a first source/drain (S/D) epitaxial layer disposed over the first fin structure not covered by the gate structure, and a cap epitaxial layer formed over the first S/D epitaxial layer. The first S/D epitaxial layer includes SiP, and the cap epitaxial layer includes SiC with a carbon concentration in a range from 0.5 atomic % to 5 atomic %.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first fin structure and a second fin structure over a substrate such that an upper portion of the first fin structure and an upper portion of the second fin structure protrude from an isolation insulating layer;
   forming a first source/drain (S/D) epitaxial layer over an S/D region of the first fin structure;
   forming a cap epitaxial layer over the first S/D epitaxial layer; and
   forming a second S/D epitaxial layer over an S/D region of the second fin structure, wherein:
   the first S/D epitaxial layer includes SiP,
   the cap epitaxial layer includes SiC or SiCP, and
   during the forming the second S/D epitaxial layer, no cover layer that protects the cap epitaxial layer is disposed on the cap epitaxial layer.

2. The method of claim 1, wherein the cap insulating layer has a carbon concentration in a range from 0.5 atomic % to 5 atomic %.

3. The method of claim 2, wherein a thickness of the cap epitaxial layer is in a range from 0.5 nm to 5 nm.

4. The method of claim 2, wherein a concentration of phosphorous in the SiP of the first S/D epitaxial layer is in a range from 5 atomic % to 20 atomic %.

5. The method of claim 2, wherein:
   the second S/D epitaxial layer is formed by using at least a Ge containing gas, and
   the second S/D epitaxial layer includes Ge or SiGe with a Ge concentration being in a range from 10 atomic % to 90 atomic %.

6. The method of claim 5, wherein during the forming the second S/D epitaxial layer, the cap epitaxial layer is exposed to the Ge containing gas.

7. The method of claim 6, wherein no Ge containing layer is formed on the cap epitaxial layer after the second S/D epitaxial layer is formed.

8. The method of claim 6, wherein after the second S/D epitaxial layer is formed, an amount of Ge on the cap epitaxial layer is less than $10 \times 10^{14}$ atoms/cm$^3$.

9. The method of claim 2, further comprising, before forming the first S/D epitaxial layer, recessing the upper portion of the S/D region of the first fin structure.

10. The method of claim 2, further comprising, before forming the second S/D epitaxial layer, recessing the upper portion of the S/D region of the second fin structure.

11. The method of claim 1, wherein the cap insulating layer has a carbon concentration in a range from 1 atomic % to 3 atomic %.

12. A method of manufacturing a semiconductor device including a static random access memory (SRAM) cell, the method comprising:
forming first fin structures for n-channel fin field effect transistors (FinFETs) and second fin structures for p-channel FinFETs for the SRAM cell over a substrate;
forming an isolation insulating layer over the substrate such that upper portions of the first fin structures and upper portions of the second fin structures protrude from the isolation insulating layer;
forming first source/drain (S/D) epitaxial layers over the first fin structures;
forming cap epitaxial layers over the first S/D epitaxial layers; and
forming second S/D epitaxial layers over the second fin structures, wherein:
the first S/D epitaxial layers include SiP,
the cap epitaxial layers include SiC or SiCP, and
during the forming the second S/D epitaxial layer, no cover layer that protects the cap epitaxial layers is disposed on the cap epitaxial layers.

13. The method of claim 12, wherein the cap epitaxial layers has a carbon concentration being in a range from 0.5 atomic % to 5 atomic %.

14. The method of claim 13, wherein in the SRAM cell, a pair of the second fin structures is disposed between a first pair of the first fin structures and a second pair of the first fin structures.

15. The method of claim 13, wherein a concentration of phosphorous in the SiP of the first S/D epitaxial layers is in a range from 5 atomic % to 20 atomic %.

16. The method of claim 13, wherein:
the second S/D epitaxial layer: include Ge or SiGe,
during the forming the second S/D epitaxial layer:, the cap epitaxial layers are exposed to a Ge containing gas, and no Ge containing layer is formed on the at least a part of the cap epitaxial layer.

17. The method of claim 13, wherein:
the second S/D epitaxial layers include Ge or SiGe,
during the forming the second S/D epitaxial layers, the cap epitaxial layers are exposed to a Ge containing gas, and
after the second S/D epitaxial layers are formed, an amount of Ge on the cap epitaxial layers is less than $10 \times 10^{14}$ atoms/cm$^3$.

18. A method of manufacturing a semiconductor device, the method comprising:
forming a first pair of first fin structures and a second pair of first fin structures for n-channel fin field effect transistors (FinFETs) and a pair of second fin structures for p-channel FinFETs over a substrate;
forming an isolation insulating layer over the substrate such that upper portions of the first and second pairs of first fin structures and upper portions of the pair of second fin structures protrude from the isolation insulating layer;
forming a first source/drain (S/D) epitaxial layer over the first pair of first fin structures and a second S/D epitaxial layer over the second pair of first fin structures;
forming a first cap epitaxial layer over the first S/D epitaxial layer and a second cap epitaxial layer over the second S/D epitaxial layer; and
forming a third S/D epitaxial layer over the pair of second fin structures, wherein:
the pair of second fin structures are disposed between the first pair of first fin structures and the second pair of first fin structures,
the first and second S/D epitaxial layers include SiP,
the cap epitaxial layers include SiC or SiCP, and
during the forming the second S/D epitaxial layer, no cover layer that protects the cap epitaxial layers is disposed on the cap epitaxial layers.

19. The method of claim 18, the first and second cap epitaxial layers has a carbon concentration in a range from 0.5 atomic % to 5 atomic %.

20. The method of claim 19, wherein the first S/D epitaxial layer and the second S/D epitaxial layer are a merged epitaxial layer.

* * * * *